AUTOMATIC FREQUENCY CONTROL SYSTEM

Filed April 29, 1948

INVENTOR.
SIDNEY FRANKEL
BY
Robert Harding Jr.
ATTORNEY

Patented June 6, 1950

2,510,095

UNITED STATES PATENT OFFICE 2,510,095

AUTOMATIC FREQUENCY CONTROL SYSTEM

Sidney Frankel, Forest Hills, N. Y., assignor to International Standard Electric Corporation, New York, N. Y., a corporation of Delaware Application April 29, 1948, Serial No. 24,046

7 Claims. (Cl. 250—36)

This invention relates to wave generating arrangements and more particularly it relates to methods and means for automatically stabilizing the frequency of a master oscillator, or the like.

A principal object of the invention is to provide an improved automatic frequency control system of the type employing a master oscillator whose frequency is to be automatically stabilized by comparison with a reference oscillator such for example as a crystal-controlled oscillator or similar highly stabilized reference frequency generator.

Another principal object is to provide an automatic frequency-responsive circuit including a frequency discriminator, for stabilizing a high frequency master oscillator by comparison with a reference oscillator, for example a crystal-controlled oscillator, and using a minimum number of high frequency or radio frequency circuits necessary to effect the stabilization.

Another object is to provide an automatic frequency stabilizing system of the type employing a master oscillator to be stabilized by comparison with a fixed frequency oscillator such as a crystal-controlled oscillator, the signal from the fixed frequency oscillator being phase or frequency modulated by a low frequency modulating signal which, for example, may be an alternating current voltage derived from the local alternating current power source.

A feature of the invention relates to a frequency stabilizing system employing a master oscillator to be stabilized by comparison with a crystal-controlled oscillator to produce a beat frequency. This beat frequency is passed through a frequency discriminator, detector, and narrow band amplifier combination. The master oscillator is frequency or phase-modulated by a low frequency signal, which latter signal is also combined with the output of the narrow band amplifier to produce a frequency control voltage for the master oscillator.

Another feature relates to an automatic frequency control system for a master oscillator, wherein the master oscillator frequency is compared with a frequency-modulated reference oscillator, the frequency modulation being effected by a low frequency alternating current signal. The resultant beat frequency between the master oscillator and the reference oscillator is passed through a special discriminator and filter arrangement for deriving a signal at the same frequency as the said modulating signal, but whose phase is a function of the frequency departure of the master oscillator from the reference frequency of the reference oscillator.

A still further feature relates to the novel circuit organization which is capable of use in stabilizing very high frequencies.

Figure 1:
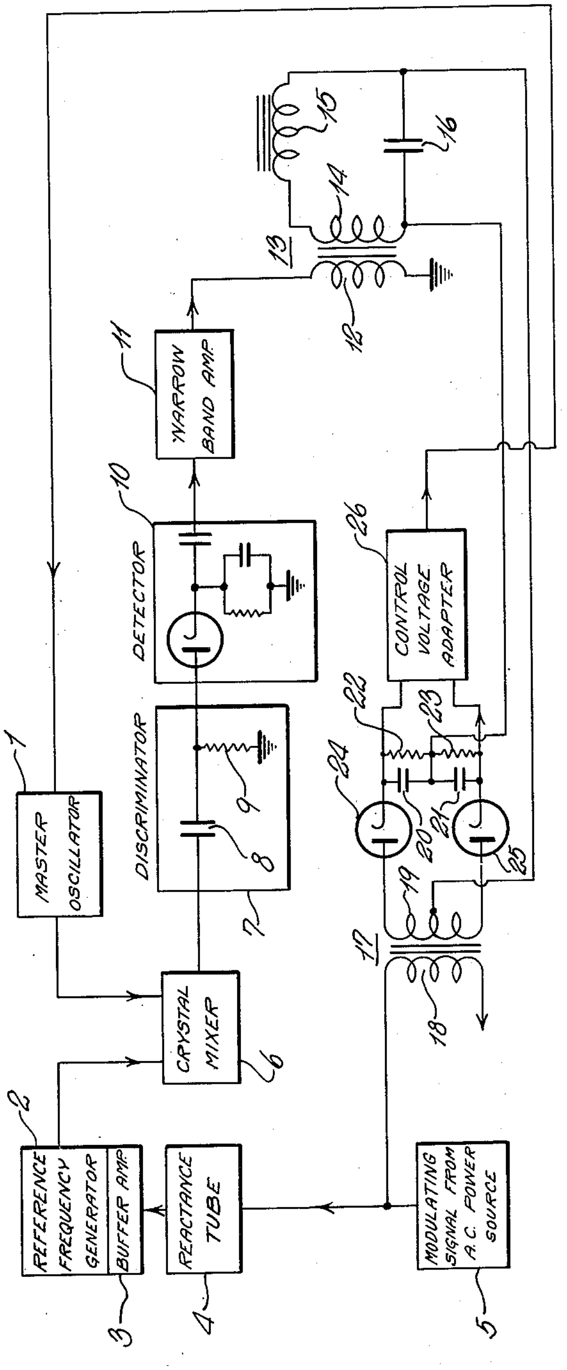

The above-mentioned and other features and objects of this invention and the manner of attaining them will become more apparent and the invention itself will be best understood, by reference to the following description of an embodiment of the invention taken in conjunction with the accompanying drawings, wherein, Fig. 1 is a schematic block and wiring diagram of an automatic frequency stabilizing arrangement according to the invention.

Figure 2:
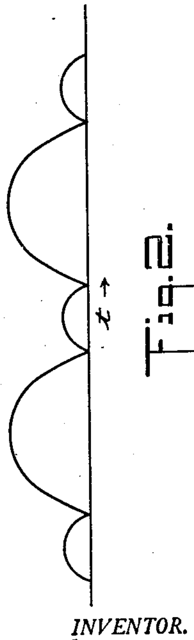
Figure 3:
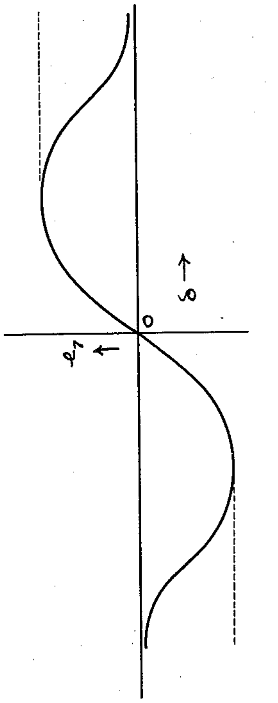

Figs. 2 and 3 respectively are graphs explanatory of the operation of certain portions of Fig. 1.

Referring to Fig. 1, the block 1 represents any well-known type oscillator generator which is to be used as a master oscillator. Oscillator 1 may be of any free-running type, such for example as a Klystron oscillator of the reflex type, or it may consist of a conventional grid-controlled electron tube oscillator. The frequency of oscillator 1 is to be maintained within very close limits, and for this purpose there is provided a standard reference frequency generator 2 of any well-known form. The generator 2 may, for example, be a crystal-controlled oscillator, or it may be an ultra high frequency oscillator whose frequency is controlled for example by a high-Q cavity. In any event, the generator 2 is preferably of the fixed and highly stabilized frequency type. The generator 2 is preferably provided with a buffer amplifier stage 3 of any well-known type, and connected to the plate circuit of this buffer stage 3 is any well-known form of reactance tube 4. The reactance tube 4 has applied thereto a low frequency modulating signal from the source 5. This modulating signal, for example, may be a sixty-cycle signal taken directly from the local alternating current power supply source. By this arrangement the signal from generator 2 is subjected to a small degree of phase modulation, or frequency modulation, but without any appreciable change in its average frequency. This frequency-modulated reference signal is then applied to any suitable mixer network 6, such for example as a crystal diode mixer of the contact type such as is conventionally used in ultra high frequency systems. Also applied to the mixer 6 is a sample of the signal from the master oscillator 1. By the well-known action of these crystal mixers, there appears in the output thereof a signal which represents the instantaneous frequency difference between the signals from devices 1 and 2. This difference is then passed through a discriminator network 7 which is generally represented in the drawing by the capacitor 8 and resistor 9. This frequency discriminator is designed so as to have a response characteristic as illustrated in Fig. 3, and wherein the center part of the linear portion of the characteristic is centered at zero frequency. In other words, if the frequency of oscillator 1 is identical with the average frequency of the generator 2, there will be zero voltage output from the discriminator 7. However, if the oscillator 1 deviates from this desired frequency, there is a signal at the output of the discriminator 7. This signal is applied to a suitable detector 10 to recover an audio frequency component of the same frequency as that from the modulating source 5. The signal from the detector 10 will lag or lead the signal from source 5, depending upon whether the master oscillator frequency 1 is higher or lower than the average reference frequency from generator 2.

After detection by detector 10, the audio frequency signal is amplified to the required level by a narrow band amplifier 11, the output of which is applied to the primary winding 12 of the audio frequency transformer 13. The secondary winding 14 of this transformer has connected to it a tuned circuit comprising the inductance 15 and capacitor 16. This tuned circuit is tuned to the fundamental of the audio frequency signal from amplifier 11, and it also serves to restore the wave shape of this signal to substantially sinusoidal form. Also, the tuned circuit connected to the secondary of transformer 13 shifts the signal by an additional 90°, so that while it is at the same frequency as that of the source 5, it is either in phase with the signal from source 5, or 180° out of phase therewith. The signal from the tuned circuit 15, 16, is then electrically added to and also subtracted from the original signal from source 5. This is effected by means of the push-pull audio frequency transformer 17 whose primary winding 18 is fed with a sample of the signal from source 5. The tuned circuit 15, 16, is connected in divided balanced or push-pull relation between the mid-point of the secondary winding 19 and the mid-point between the two condensers 20, 21, and the mid-point between the two corresponding resistors 22, 23. The opposite ends of the secondary 19 are connected through respective rectifiers 24, 25, so as to subject the sum and difference between the voltages from the tuned circuit 15—16 and the source 5 to separate rectifications. The two rectified voltages are combined in additive relation and are applied to a suitable "control voltage adapter" circuit or device 26 whose output is connected to the master oscillator 1. If master oscillator 1 is a reflex Klystron, the voltage from the rectifiers 24 and 25 can be applied to the repeller electrode of the Klystron to control the Klystron generated frequency in the well-known manner. If the oscillator 1 is of the grid-controlled electron tube type, having a frequency control circuit including for example an adjustable capacitor or inductance, the device 26 can be a suitable electric motor, such as a well-known Thyratron motor control arrangement, whose direction and extent of rotation are determined by the amplitude of the voltage from the rectifiers 24, 25. In the above-described example where the source 5 is the ordinary 60 cycle alternating current power supply, this motor can be of the two-phase type, one of the phases being supplied from the source 5, and the other phase being supplied directly from the amplifier 11, thus eliminating the elements 12 through 25.

The quantitative theory of the discriminator 7 will now be described. Let the reference signal generated in reference frequency generator 2 in the absence of modulating signal be $$e_1 = a_1 \sin pt \qquad (1)$$

and let the modulating voltage applied to the reactance tube be represented by $$e_m = a_m \sin ut \qquad (2)$$

The reactance tube produces a phase shift proportional to the voltage $$\phi_m - b_m \sin ut \qquad (3)$$

A reactance tube need not necessarily be used. A certain amount of frequency shift could be obtained by varying the oscillator screen voltage, for example.

After modulation the control signal (Equation 1) becomes, by virtue of (Equation 3)

$$e_1 = a_1 \sin (pt + b_m \sin ut) \qquad (4)$$

Let the controlled signal of master oscillator 1 be represented by $$e_2 = a_2 \sin (qt - \phi) = \sin [(p+\delta)t - \phi] \qquad (5)$$

where $\delta$ is the algebraic difference between $p$ and $q$, and $\phi$ is an arbitrary phase constant. If these two signals, (Equation 4) and (Equation 5) are mixed and the difference-frequency component abstracted, the result is $$e_3 = a_3 \cos \{(pt + b_m \sin ut) - ([p+\delta]t - \phi)\}$$
$$= a_3 \cos (\delta t - b_m \sin ut - \phi) \qquad (6)$$

$a_3$, $\delta\phi$, and $b_m$ are restricted only to be real.

Next, in a sufficiently small neighborhood of zero frequency we can take the characteristic of discriminator 7 to be given by $$e_0 = a_4 w e_i \qquad (7)$$

where $w$ is the instantaneous angular frequency of the applied signal; $e_0$ is the output voltage; and $e_i$ is the input voltage. Then since in (Equation 6)

$$w = \left|\frac{d\theta}{dt}\right| = |\delta - ub_m \cos ut| \qquad (8)$$

we get $$e_4 = a_3 a_4 (|\delta - ub_m \cos ut|) \cos (\delta t - b_m \sin ut - \phi) \qquad (9)$$

If now we detect for the envelope of (Equation 9) we get $$e_5 = |a_3 a_4 (\delta - ub_m \cos ut)| \qquad (10)$$

Without loss of generality assume now that $a_3 a_4 > 0$, $b_m > 0$. This can always be arranged, if necessary. The assumption places no important restriction on this proof.

Assuming first a condition where $|\delta| \cdot |ub_m|$ we have to consider two cases:

(1) $$\delta > 0$$

Let $$\delta = S > 0$$

Then $$e_5 = a_3 a_4 (S - ub_m \cos ut)$$

(2) $$\delta < 0 \cdot \delta = -S$$

Then $$e_5 = a_3 a_4 (S + ub_m \cos ut)$$

On removing the D. C. term through a blocking condenser we now have applied to the narrow band amplifier F $$e_6=-a_3a_4ub_m \cos ut,\ \delta>0 \qquad (11)$$
$$e_6=a_3a_4ub_m \cos ut,\ \delta<0$$

provided $|\delta|\geqq|ub_m|$

Thus the phase of $e_6$ depends on the sign of $\delta$ which is essentially what we wish to accomplish. It is necessary, however, to take care of the important condition where $|\delta|\leqq|ub_m|$ which exists as the controlled oscillator falls into step with the reference generator.

For $|\delta|\leqq|ub_m|$ Eq. (4) (with $a_3a_4>0b_m>0$) yields a result generally as shown in Fig. 2, for $\delta>0$. For $\delta<0$ the picture is the same with the ordinates reversed. A Fourier analysis for the fundamental component yields $$\left.\begin{aligned} e_6&=-a_3a_4ub_m\left\{\frac{2}{\pi}(X\sqrt{1-X^2}-\cos^{-1}X)+1\right\}\cos ut,\ 0\leqq\delta\leqq ub_m\\ e_6&=a_3a_4ub_m\left\{\frac{2}{\pi}(X\sqrt{1-X^2}-\cos^{-1}X)+1\right\}\cos ut,\ -ub_m\leqq\delta\leqq 0\end{aligned}\right\}\quad(12)$$

where $$X=\frac{S}{ub_m}$$

The whole characteristic for $e_6$ is now given by (Equation 11) and (Equation 12) as long as the discriminator is in its linear region (Equation 7). As $S\rightarrow0$, $X\rightarrow0$ also, and Equation 12 then shows that $e_6$ also tends to zero. Thus, if we filter all but the fundamental component we obtain a control voltage that changes sign with change in sign of the frequency error, and goes to zero with the frequency error. The tuned circuit in the secondary of transformer G performs this filtering at the same time as it shifts the voltage back to a sine function.

The D. C. voltage developed after rectification is easily seen to be $$\left.\begin{aligned} |e_7|&=2a_3a_4ub_m\ |\delta|\geqq ub_m\\ |e_7|&=2a_3a_4ub_m\left\{\frac{2}{\pi}(X\sqrt{1-X^2}-\cos^{-1}X)+1\right\},\ |\delta|\leqq ub_m\end{aligned}\right\}\quad(13)$$

The idealized characteristic obtained with a linear discriminator is shown dotted in Fig. 3. Actually, as $|\delta|\rightarrow\infty$, the discriminator output becomes independent of frequency and the A. C. voltage developed falls asymptotically to zero as $|\delta|\rightarrow\infty$ as indicated in the solid curve of Fig. 3. The sign of this voltage does not reverse, however. The system, is therefore suitable as an automatic frequency selection system as well.

In case the modulating voltage (Equation 2) is derived from the local power source, and in case the frequency of the controlled oscillator is adjustable by a motor-driven mechanism, the motor can be of the two-phase type, and one of the phases can be taken directly out of the narrow band amplifier 11 without further modification, and the remaining components of the block diagram of Fig. 1 are unnecessary. The other phase is taken directly from the power supply.

In the discriminator 7 it is easily shown that when the angular frequencies of oscillator and reference generator differ by $\delta$, the largest alternating current voltage is developed where $$RC=\frac{1}{\delta\sqrt{2}} \qquad (14)$$

and that when the constants are so chosen, then the alternating current voltage actually developed is $$e_b=0.385\frac{\Delta p}{\delta}a_3\cos ut \qquad (15)$$

where $\Delta p$ is the frequency-modulation angular frequency deviation.

While I have described above the principles of my invention in connection with specific apparatus, it is to be clearly understood that this description is made only by way of example and not as a limitation to the scope of my invention.

What is claimed is:

1. An automatic frequency control arrangement, comprising an oscillator whose frequency is to be controlled, a standard reference frequency generator, means to phase-modulate the signal from said generator by a low frequency alternating current without changing the average frequency of the generator signal, a frequency mixer device, means to impress upon said device a sample of the frequency from said oscillator and a sample of the phase-modulated signal from said generator to produce a beat frequency, a frequency discriminator network upon which said beat frequency is impressed, a detector for detecting from the output of said discriminator a component of the same frequency as said modulating frequency but whose phase with respect to said modulating frequency is in accordance with the deviation of said oscillator from its predetermined frequency, and phase comparison means, including circuit connections between said detector, said modulator and said oscillator, for deriving and applying to said oscillator a correction voltage controlled by the phase difference between said component and said modulating frequency.

2. An automatic frequency control arrangement, comprising an oscillator whose frequency is to be controlled, a frequency-stabilized reference frequency generator, a source of low frequency alternating current, a phase-modulating device between said source and said reference generator for phase-modulating the signal from said generator without changing the average generator frequency, a mixer device connected to the output of said generator and to said oscillator to produce a beat frequency when said oscillator deviates from its predetermined frequency, a frequency discriminator network connected to said mixer, a detector connected to said discriminator for detecting a component of said beat frequency which has the same frequency as said low frequency source, a combining network for combining the signal from said detector with a sample of the said low frequency to produce an oscillator control voltage corresponding to the difference in phase between the said detected component and said low frequency.

3. A frequency control arrangement according to claim 2, in which the said detector is connected to said combining network through a filter circuit which is tuned to the fundamental frequency of said detected component.

4. An automatic frequency control arrangement according to claim 2, in which said combining network is connected to said detector through a tuned circuit which is tuned to the fundamental frequency of the detected component and produces a quadrature phase relation between said detected component and said low frequency.

5. An automatic frequency control arrangement, comprising a master oscillator, a reference frequency generator, a frequency mixer device upon which a sample of the signals from said master oscillator and from said frequency generator are impressed, means including a source of low frequency alternating current for phase-modulating the signal from said generator without changing the average generated frequency, a frequency discriminator connected to said mixer, a detector connected to said discriminator for detecting a component of the discriminator output which has the same frequency as said low frequency source, a pair of rectifiers, means to apply to said rectifiers in push-pull relation a sample of the voltage from said low frequency source, means to apply, simultaneously to said rectifiers in divided balanced relation, voltage controlled by said detected component but in quadrature phase with respect to said low frequency voltage, means to derive from said rectifiers an oscillator control voltage corresponding to the sum and difference of said low frequency voltage and said phase quadrature voltage, and circuit connections for applying said oscillator control voltage to said master oscillator to maintain said master oscillator at a predetermined frequency.

6. An automatic frequency control arrangement according to claim 5, in which the said detector is connected to the input of a narrow band amplifier and the output of said amplifier is connected through a filter circuit to said rectifiers, which filter circuit is tuned to the fundamental frequency of said detected component.

7. An automatic frequency control arrangement, comprising a master oscillator, a reference frequency generator, a crystal mixer upon which samples of the signals from said master oscillator and said generator are simultaneously impressed to produce a difference frequency, a source of low frequency alternating current power, a reactance tube connected to said source and to said generator to phase-modulate the signal from said generator without changing the average generator frequency, a frequency discriminator network connected to said crystal mixer and having a linear portion of its response characteristic centered at a frequency representing the predetermined frequency of said master oscillator, a detector connected to the output of said discriminator for detecting a component of the same frequency as said low frequency alternating current, a narrow band amplifier connected to said detector for amplifying said component, a filter network coupled to the output of said amplifier and tuned to the fundamental frequency of said detected component, an audio frequency transformer having its primary supplied with current from said low frequency alternating current source, a pair of rectifiers connected in push-pull relation across the secondary of said transformer, circuit connections for connecting said filter in divided balanced relation between the electrical mid-point of the secondary winding of said transformer and the electrical mid-point of the common output circuit of said rectifiers, means to derive from the said common output an oscillator control voltage and circuit connections for applying said control voltage to said master oscillator to maintain said master oscillator at said predetermined frequency.

SIDNEY FRANKEL.

REFERENCES CITED

The following references are of record in the file of this patent:

UNITED STATES PATENTS

| Number | Name | Date |
|---|---|---|
| 2,283,523 | White | May 19, 1942 |
| 2,414,100 | Hansen et al. | Jan. 14, 1947 |
| 2,445,663 | Doelz | July 20, 1948 |
| 2,452,575 | Kenny | Nov. 2, 1948 |